US010164816B2

(12) United States Patent
Lankl

(10) Patent No.: US 10,164,816 B2
(45) Date of Patent: Dec. 25, 2018

(54) DEVICE AND METHOD FOR TRANSMITTING DATA

(71) Applicant: Universitaet der Bundeswehr Muenchen, Neubiberg (DE)

(72) Inventor: Berthold Lankl, Egmating (DE)

(73) Assignee: Universitaet der Bundeswehr Muenchen, Neubiberg (DE)

( * ) Notice: Subject to any disclaimer, the term of this patent is extended or adjusted under 35 U.S.C. 154(b) by 0 days.

(21) Appl. No.: 15/678,544

(22) Filed: Aug. 16, 2017

(65) Prior Publication Data

US 2018/0019907 A1    Jan. 18, 2018

Related U.S. Application Data

(63) Continuation of application No. PCT/EP2016/052316, filed on Feb. 3, 2016.

(30) Foreign Application Priority Data

Feb. 16, 2015   (EP) .................................. 15155267

(51) Int. Cl.
   H04K 1/02       (2006.01)
   H04L 25/03      (2006.01)
   (Continued)

(52) U.S. Cl.
   CPC .............. *H04L 27/366* (2013.01); *H03F 1/32* (2013.01); *H03F 1/3223* (2013.01); *H03F 3/24* (2013.01);
   (Continued)

(58) Field of Classification Search
   CPC ....... H04L 26/366; H04L 27/12; H04L 27/04; H03F 1/32; H03F 3/24; H03F 1/345; H03F 1/0205
   (Continued)

(56) References Cited

U.S. PATENT DOCUMENTS

| 5,694,433 A | 12/1997 | Dent |
| 2006/0094376 A1* | 5/2006 | Lee ..................... H03F 1/0205 455/118 |

(Continued)

FOREIGN PATENT DOCUMENTS

| EP | 0 782 789 A1 | 9/1997 |
| EP | 1 503 495 A2 | 2/2005 |

OTHER PUBLICATIONS

Tommy Svensson et al., "Maximizing Minimum Euclidean Distance of Spectrally Constrained Partial Response CPM", Proceedings 53$^{rd}$ Vehicular Technology Conference (Spring) IEEE, 2001, pp. 1244-1248.

A.M. Lehmann et al., "Single Antenna Interference Cancellation for Complex Valued Signal Constellations with Applications to GSM/EDGE", Proceedings 22$^{nd}$ International Symposium on Personal, Indoor and Mobile Radio Communications, IEEE, 2011, pp. 1417-1422.

(Continued)

*Primary Examiner* — Phuong Phu

(74) *Attorney, Agent, or Firm* — Muncy, Geissler, Olds & Lowe, P.C.

(57) ABSTRACT

A method for transmitting data, wherein along a transmission path: (i) a modulated carrier signal is generated based on the data to be transmitted, the carrier signal having a carrier frequency within a given transmission channel, which is comprised of a number of frequencies, and (ii) the modulated carrier signal is amplified to a transmission signal, wherein along a compensation path: (i) the modulated carrier signal is filtered, whereby the frequency components within the transmission channel are removed, and at least one of a phase, an amplitude, and/or a delay of the filtered signal is modified thereby generating a compensation signal, and wherein the compensation signal is subtracted from the transmission signal thereby generating a compensated transmission signal, and wherein the compensated transmission signal is transmitted. Also a respective data transmission device is disclosed.

14 Claims, 6 Drawing Sheets

(51) Int. Cl.
*H04L 25/49* (2006.01)
*H04L 27/36* (2006.01)
*H03F 1/32* (2006.01)
*H04B 1/04* (2006.01)
*H04L 27/12* (2006.01)
*H04L 27/20* (2006.01)
*H03F 3/24* (2006.01)
*H04L 27/04* (2006.01)

(52) U.S. Cl.
CPC .......... *H03F 3/245* (2013.01); *H04B 1/0475* (2013.01); *H04L 27/04* (2013.01); *H04L 27/12* (2013.01); *H04L 27/2003* (2013.01); *H04L 27/368* (2013.01); *H04B 2001/0408* (2013.01)

(58) Field of Classification Search
USPC ................................................ 375/296, 297
See application file for complete search history.

(56) References Cited

U.S. PATENT DOCUMENTS

2011/0190028 A1* 8/2011 Hahn ...................... H03F 1/345
455/550.1
2013/0095776 A1 4/2013 Kavousian et al.

OTHER PUBLICATIONS

Jungwon Lee et al., "Interference Mitigation via Joint Detection", IEEE Journal on Selected Areas in Communications, vol. 29, No. 6, (Jun. 2011), pp. 1172-1184.
Bo Shi et al., "An Analog Adaptive Feedforward Amplifier Linearizer", 34$^{th}$ European Microwave Conference—Amsterdam, pp. 1065-1068, (2004).

* cited by examiner

DEVICE AND METHOD FOR TRANSMITTING DATA

This nonprovisional application is a continuation of International Application No. PCT/EP2016/052316, which was filed on Feb. 3, 2016, and which claims priority to European Patent Application No. 15 155 267.6, which was filed in Europe on Feb. 16, 2015, and which are both herein incorporated by reference.

BACKGROUND OF THE INVENTION

Field of the Invention

The present invention relates to a method for transmitting data, wherein along a transmission path a modulated carrier signal is generated based on the data to be transmitted, wherein the carrier signal has a carrier frequency within a given transmission channel, which is comprised of a number of frequencies, and wherein the modulated carrier signal is amplified to a transmission signal. The invention further relates to a data transmission device comprising along a transmission path a modulator, an amplifier and a transmitter for transmitting a transmission signal provided according to the prescribed method.

Description of the Background Art

In data communication systems for multiple users frequency multiplexing is often used to allow multiple communication in distinct frequency channels within the allocated frequency spectrum. In GSM for example, frequency channels with a bandwidth of 200 kHz are used for frequency multiplexing. Additionally, each of these frequency channels is used for eight different users by time multiplexing. Other examples are military VHF radio communication systems, wherein within an allocated frequency spectrum of 30 to 80 MHz distinct communication channels with a bandwidth of 25 kHz are used.

By frequency multiplexing in each of the communication channels a separate signal can be transmitted. Due to practical reasons and due to the real characteristics of implemented electrical and electronical components, for example an electronical power amplifier, the communicated signals generally comprise undesired frequency components outside of the specific channel used for transmission. The frequency components of a transmitted signal falling outside the used communication channel have to fulfil certain requirements to establish an effective operation of the communication system. It has to be made sure, for example, that the intensity of the signal transmitted at frequencies outside the used channel does not exceed a threshold when compared with the intensity of the signal transmitted at frequencies within the channel.

From US 2013/0095776 A1 it is known to remove in an analog composite signal, which is generated by a digital-to-analog converter and which comprises a transmission signal component and spectral image signal components, the spectral image components. The analog composite signal is filtered to yield an analog spectral image error signal comprising the spectral images. The error signal is amplified and the amplified error signal is combined with the analog composite signal thereby yielding the analog transmission signal component.

More problematic is the situation in mobile communication systems, where mobile users at variable distances communicate in adjoint channels with a given bandwidth. A respective filter at the receiver side might be able to suppress the frequencies in adjoint communication channels. However, the frequency components of a signal transmitted in an adjoint channel, falling within the own transmission channel, are not suppressed. In case of a near-by transmitter, the frequency components of signals transmitted in adjoint channels become significant in comparison to the signal of the regarded channel itself. Upon a specific threshold noise arising from adjoint signals within the own channel is not tolerated from the used transmission technique.

One possible solution of the discussed problem is to keep the signal components at frequencies outside the own channel as small as possible. However, in linear modulation methods, for example QPSK, 8-PSK or QAM, the non-linear characteristics of the power amplifier used for amplifying the transmitted signal, will broaden the spectral range of the signal. Hence, the back-off of the amplifier has to be increased, and the amplifier becomes less efficient.

In modulating methods with a constant envelope waveform, for example CPM (continuous phase modulation) or unfiltered M-PSK (multi level phase shift keying), the non-linear distortions of a power amplifier due to the constant level of the signal to be amplified do not change the spectral shape. The signal spectrum only depends on the already given signal form. However, continuous phase modulation methods mostly operate with time limited phase pulses. Accordingly, the modulated signals show a relative broad spectral range as such. Use of an optimized signal shape will narrow the spectral range. However, the transmission method using a signal with an optimized shape becomes typically more noise sensitive.

Due to the fact that the non-linearities of a power amplifier do not change the spectral shape of signals with a constant envelope waveform, modulation methods with constant envelope signals are preferred in mobile communication standards, for example in GSM, in terrestrial trunked radio (TETRA) for government agencies, emergency services, transport services and military, in VHF- or UHF military radio, in radio relay systems and in satellite radio communication.

SUMMARY OF THE INVENTION

It is therefore an object of the invention to provide a method for the transmission of data using frequency multiplexing, wherein interferences between signals transmitted in different transmission or communication channels are decreased. It is also an object of the invention to provide a data transmission device for transmitting data using frequency multiplexing, wherein interferences between signals transmitted in different transmission or communication channels are decreased.

According to an exemplary embodiment of the invention, the object is achieved for a method for transmitting data, wherein along a transmission path a modulated carrier signal is generated based on the data to be transmitted, which carrier signal has a carrier frequency within a given transmission channel, which is comprised of a number of frequencies, and the modulated carrier signal is amplified to a transmission signal by virtue of the fact that along a compensation path the modulated carrier signal is filtered, whereby the frequency components within the transmission channel are removed, and at least one of a phase, an amplitude and a delay of the filtered signal is modified thereby generating a compensation signal, wherein the compensation signal is subtracted from the transmission signal thereby generating a compensated transmission signal, and wherein the compensated transmission signal is transmitted.

According to an exemplary embodiment of the invention, the object is achieved for a data transmission device comprising along a transmission path a modulator, an amplifier and a transmitter by virtue of the fact that along a compensation path a filter and adapter for modifying at least one of a phase, an amplitude and a delay of a signal travelling along the compensation path are comprised, wherein further the compensation path and the transmission path are coupled with a coupler located upstream of the transmitter, which coupler is designed for subtracting the output signal of the compensation path from the output signal of the transmission path.

Here, the invention proceeds from the consideration that one possible method to eliminate frequency components of the transmitted signal outside the used transmission channel is to implement a filter downstream of the power amplifier in the transmission path. However, this method practically cannot be realized due to the large ratio of the carrier frequency to the band width of the transmission channel in state of the art radio communication systems. In GSM, for example, the carrier frequency is 900 MHz at a bandwidth of 200 kHz, which gives a ratio of 4500. Additionally, a filter placed downstream of the power amplifier has to be designed with low-loss characteristics for large signal intensities. This cannot be easily achieved in case of a large ratio of the carrier frequency to the channel band width, which increases the costs of a respective filter.

In case the modulated carrier signal as such already comprises frequency components outside the used transmission channel, which is, for example, given with CPM-signals, a filter also could be placed upstream of the power amplifier. However, a signal passing the filter will loss its constant envelope waveform and the power amplifier due to its non-linear characteristics will reconstruct the frequency components outside the used channel. Accordingly, the effect of a filter placed upstream of a power amplifier is lost. When, on the other hand, the amplification of the power amplifier is decreased, the advantage of high efficient transmission methods using signals with a constant envelope waveform is lost.

Another approach might be an optimized design of the transmitted signals with regard to both the spectral range and the constant envelope waveform. However, it has been shown in T. Svensson und A. Svensson, "Maximizing Minimum Euclidean Distance of Spectrally Constrained Partial Response CPM", Proceedings 53$^{rd}$ Vehicular Technology Conference (Spring), IEEE, 2001, p. 1244-1248 that a significant elimination of undesired frequency components is not possible without increasing the noise sensitivity of the transmission system.

Yet another approach is to estimate the interfering signal at the receiver side and to subtract the estimated interfering signal from the transmitted signal (see A. M. Lehmann u.a. "Single Antenna Interference Cancellation for Complex Valued Signal Constellations with Applications to GSM/EDGE", Proceedings 22$^{nd}$ International Symposium on Personal, Indoor and Mobile Radio Communications, IEEE. 2011, p. 1417-1422.). However, the estimation methods only work with interfering signals being small compared to the transmitted signal.

It is further known from J. Lee, D. Toumpakaris und W. Yu, "Interference Mitigation via Joint Detection", IEEE Journal on Selected Areas in Communications 29.6 (2011), p. 1172-1184.), to evaluate at the receiver side the frequency components of the transmitted signal not only in the used channel but also in the adjoint transmission channels. However, the receiver unit then will become complex and costly. Depending from the used modulation and detection method the needed investment can increase exponentially and a respective method becomes unrealizable.

According to an embodiment of the invention, the power amplifier can be bypassed by a compensation path, and the modulated carrier signal as such is used for a compensation of the amplified signal before its transmission. Particularly, the spectrum of a modulated carrier signal with a constant envelope wave form is nearly not changed by a non-linear power amplifier. Taking this into consideration, it becomes clear that a filtered modulated carrier signal itself can be used to eliminate the undesired frequency components of the amplified transmission signal. If the frequency components within the used transmission channel are removed in the modulated carrier signal, the remaining signal or compensation signal only contains the undesired frequency components and can be used to effectively eliminate these frequency components in the amplified transmission signal by subtraction. The compensation signal has to be only adapted in its phase, in its amplitude and/or in its time delay respectively before subtraction.

According to an embodiment of the invention, the elimination of the undesired frequency components takes place downstream of the power amplifier. Therefore, a constant envelope waveform of a signal to be transmitted is not changed before amplification. Hence, a power amplifier with high non-linear distortions can be used and a large efficiency in amplification is reached. The described compensation method compared to a direct filtering of the amplified signal is also more cost-effective due to the fact that a low-loss filter with a narrow bandwidth suitable for high carrier frequencies is difficult to realize. The compensation method according to the invention has the further advantage, that no undesired spectral components are transmitted. Large differences in the amplitudes of signals transmitted in adjoint channels make no problem.

According to an embodiment the modulated carrier signal can be generated with a constant envelope wave form. This, for example, is the case in angle modulation methods like phase or frequency modulation methods. The spectrum of a signal with a constant envelope waveform is not changed by a non-linear power amplifier. Signals with a constant envelope waveform can be amplified with high efficiency. However, such signals compared to signals of modulation methods with a variable envelope show an increased intensity level of the frequency components outside its own transmission channel. The invention provides for a powerfull method to use the efficient modulation methods with signals having a constant envelope waveform, where the undesired frequency components outside the used transmission channel are removed downstream of the amplifier. The frequency components of the amplified signal are effectively removed by subtracting a compensation signal, which is a filtered signal of the modulated carrier signal itself before amplification.

The described method can be used for digital and for analog signals as well. The modulated carrier signal can be generated according to one of the methods of frequency modulation (FM), frequency shift keying modulation (FSK), phase modulation (PM), phase shift keying modulation (PSK) and continuous phase modulation (CPM). These methods use modulated carrier signals with a constant envelope waveform for the transmission of digital or analog data. In an embodiment the modulated carrier signal can be amplified in the transmission path with a non-linear power amplifier. Particularly, a non-linear power amplifier can be used for the amplification of signals with a constant envelope waveform with a large efficiency.

Advantageously, the modulated carrier signal along the transmission path and the compensation signal along the compensation path can each be frequency up-converted to a radio frequency (RF) signal. The invention, in principle, is directly realizable at radio frequencies. However, at high carrier frequencies the needed filter elements to generate the compensation signal are complex and costeffective. Accordingly, it is preferred to generate a modulated carrier signal with a low frequency, to filter the low frequent modulated carrier signal and to up-convert its frequency downstream of the filter element along the compensation path. Preferably, both the modulated carrier signal along the transmission path and the compensation signal along the compensation path are frequency up-converted to a radio frequency signal upstream of the respective amplifier.

According to an embodiment the modulated carrier signal can be generated with a carrier frequency within an intermediate frequency band, and both the modulated carrier signal and the compensation signal are frequency up-converted to a radio frequency signal. Particularly, the modulator generates the modulated carrier signal as a digital signal with a carrier frequency within an intermediate frequency band, the digital signal being discrete in time and value. With a digital to analog converter (DAC) the discrete digital signal of the modulated carrier signal then is transformed to a continuous signal, which is used for transmission. Preferably, a digital filter element is used and the DAC is placed in the compensation path downstream of the digital filter element. It is also preferred to digitally adapt at least one of the phase, the amplitude and the time delay of the modulated carrier signal. The adapter then in the compensation path have to be placed upstream of the DAC.

Advantageously, the frequency up-conversion of both the modulated carrier signal and the compensation signal are realized by frequency-mixing. Local oszillator RF signals generated in a radio frequency synthesizer are used, for example, for frequency mixing.

According to an embodiment the modulated carrier signal can be generated with an in-phase component and with a quadrature component, and both the modulated carrier signal and the compensation signal are frequency up-converted with a quadrature-mixer to a radio frequency signal. Particularly, the in-phase component and the quadrature component both are digitally generated. The digital signals are then converted to continuous signals using one DAC for the in-phase component and another DAC for the quadrature component.

In an embodiment the compensated transmission signal along a feedback path can be compared with the compensation signal or with the filtered signal and at least one of a phase, an amplitude and a delay of the compensation signal is adapted based on the comparison result. With the comparison of the transmission signal to the compensation signal or to the filtered signal an adaptive modification of the phase, the amplitude and/or the delay of the compensation signal can easily be achieved to reach an effective compensation of the undesired frequency components outside the used transmission channel particularly with signal parameters varying in time.

The cross-correlation of the compensated transmission signal and the compensation signal or the cross-correlation of the compensated transmission signal and the filtered signal can be regarded for comparison. The cross-correlation function allows specifically analyzing the differences in phase, in amplitude and/or in delay between the regarded signals.

In case of a modulated carrier signal generated discrete in time and value it is preferred to digitize the compensated transmission signal along the feedback path and to compare the digital compensated transmission signal with the digital compensation signal, which is the filtered and adapted digital modulated carrier signal.

Particularly, the invention is suitable for radio transmission of data. Preferably, an antenna is used for transmitting the compensated transmission signal by wireless transmission.

As already mentioned above, the elimination of the undesired frequency components outside the used transmission channel destroy a constant envelope waveform of the transmitted signals. Therefore, the power amplifier in the transmission path should be blocked from receiving a compensation signal. Preferably, reflection signals from an antenna back into the transmission path are therefore blocked. Additionally, it is preferred to block travelling of the compensation signal back to the non-linear amplifier along the transmission path. Both can be achieved when a respective isolating element, for example a circulator, is placed in the transmission path between the power amplifier and the coupler or between the power amplifier and the antenna respectively.

According to an embodiment with regard to the data transmission device along the feedback path, a comparator is provided that can be connected i) with the transmission path upstream of the transmitter and downstream of the amplifier, ii) with the compensation path downstream of the adapter, and iii) with the adapter, wherein the comparator is further designed to control the adapter for modifying at least one of a phase, an amplitude and a delay of a signal travelling along the compensation path.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
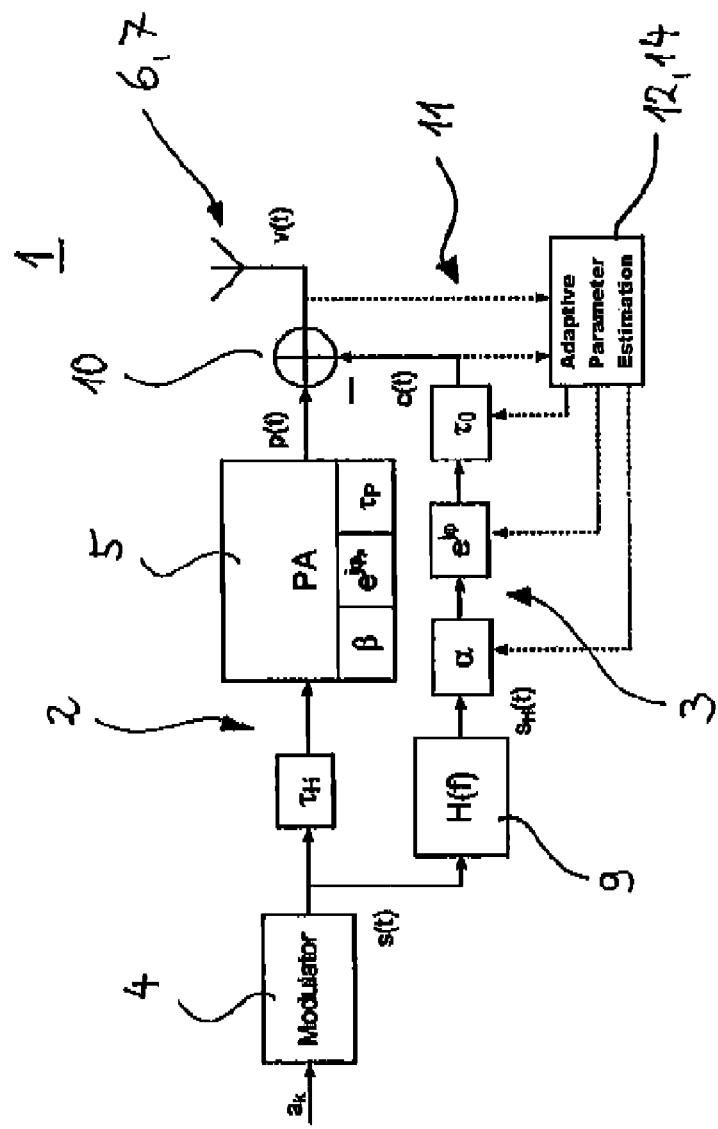
FIG. 1 shows a block diagram explaining the basic concept for the compensation of undesired frequency components.

FIG. 1 shows a data transmission device 1 for the transmission of data. Along a transmission path 2 data $a_k$ of an alphabet A, for example a binary alphabet $A \in \{-1, +1\}$, are received at a modulator 4. The modulator 4 on the basis of the received data $a_k$ generates, for example according to a continuous phase modulation method (CPM), a modulated carrier signal s(t). The modulated carrier signal s(t) along the transmission path 2 after a specific delay time $\tau_H$ is amplified in a power amplifier 5 with a factor $\beta$, thereby receiving a change in phase $\phi_P$ and another delay time $\tau_P$. Accordingly, the output signal of the power amplifier 5 or transmission signal p(t) respectively, is given as:

$$p(t) = \beta \cdot e^{j\varphi_P} \cdot s(t - \tau_H - \tau_P)$$

A transmitter 6, for example an antenna 7, is implemented for transmitting the transmission signal p(t). The transmission signal p(t) comprises frequency components within the used transmission channel and also undesired frequency components outside the used channel, which interfere with transmission signals in adjoined transmission channels with the allocated frequency band.

For compensation, along a compensation path 3 the modulated carrier signal s(t) is fed to a filter 9 having a response function H(f). The response function H(f) of the filter 9 is designed to eliminate in the modulated carrier signal s(t) the frequency components within the used transmission channel. Accordingly, the output signal $s_H(t)$ of the filter 9 is essentially comprised of the undesired frequency components outside the used channel. Along the compensation path 3 the signal $s_H(t)$ is further adapted in its amplitude by an amplification with the factor $\alpha$, in its phase $\varphi$ and in its delay time $\tau_0$ thereby generating an optimized compensation signal c(t), which is given as:

$$c(t) = \alpha \cdot s_H(t - \tau_0) \cdot e^{j\varphi}$$

The amplification factor $\alpha$, the phase $\varphi$ and the delay time $\tau_0$ are adapted to reach an effective compensation of the undesired frequency components contained in the amplified transmission signal p(t) by subtraction of the compensation signal c(t) in the coupler 10. After subtraction of the compensation signal c(t) from the amplified transmission signal p(t) the compensated transmission signal v(t) to be transmitted over antenna 7 becomes:

$$v(t) = p(t) - c(t) = \beta \cdot s(t - \tau_H - \tau_P) \cdot e^{j\varphi_P} - \alpha \cdot s_H(t - \tau_0) \cdot e^{j\varphi}$$

A simple solution of this equation is given by adapting the parameters $\alpha = \beta$, $\tau_0 = \tau_H + \tau_P$ and $\varphi = \varphi_P$ in case of a rectangular highpass filter $H(f) = 1 - \text{rect}(f/2B)$. In the compensated transmission signal v(t) all frequency components outside the bandwidth B are completely eliminated.

In real systems the parameters $\beta$, $\tau_H$, $\tau_P$ and in particular $\varphi_P$ are not constant over time and temperature. There is a need for an adaptive modification of these parameters. This can be achieved, for example, by regarding the cross-correlation between the compensation signal c(t) and the compensated transmission signal v(t). The cross-correlation can be determined in the regarded system as:

$$l_{cv}(\tau) = \lim_{T \to +\infty} \frac{1}{T} \int_{-T/2}^{+T/2} c^*(t) \cdot v(t+\tau) dt$$

If the signals c(t) and v(t) are defined in a specific time period of $-T/2 \leq t < T/2$ with $c_T(t)$ and $v_T(t)$, the spectra $C_T(f) = F\{c_T(t)\}$ and $V_T(f) = F\{v_T(t)\}$ can be calculated by using the Fourier transform function $F\{\ldots\}$. The cross-correlation function then can be written as:

$$l_{cv}(\tau) = \lim_{T \to +\infty} \frac{1}{T} \int_{-\infty}^{+\infty} C_T^*(f) \cdot V_T(f) \cdot e^{j2\pi f \tau} df$$

One possible approach to calculate the parameters $\alpha$, $\varphi$ and $\tau_0$ is, to analyze the cross-correlation function at $\tau = 0$. The cross-correlation function then is:

$$l_{cv}(0) = \lim_{T \to +\infty} \frac{1}{T} \int_{-\infty}^{+\infty} S_T^*(f) H^*(f) \alpha e^{-j\varphi}$$
$$e^{j2\pi f \tau_0} \cdot [S_T(f) e^{-j2\pi f(\tau_H + \tau_P)} \beta e^{j\varphi_P} - S_T(f) H(f) \alpha e^{j\varphi} e^{-j2\pi f \tau_0}] df$$

Having a linear phase $|H(f)| \cdot e^{-j2\pi f \tau_H}$ filter with $H(f) =$ then it results:

$$l_{cv}(0) = \lim_{T \to +\infty} \frac{1}{T} \int_{-\infty}^{+\infty} |S_T(f)|^2 [$$
$$|H(f)| e^{j2\pi f \tau_H} \alpha \beta e^{j(\varphi_P - \varphi)} e^{-j2\pi f(\tau_H + \tau_P - \tau_0)} - |H(f)|^2 \alpha^2] df$$

This can be simplified to:

$$l_{cv}(0) = \lim_{T \to +\infty} \frac{1}{T} \int_{-\infty}^{+\infty} |S_T(f)|^2 \cdot |H(f)| [\alpha \beta e^{j(\varphi_P - \varphi)} e^{-j2\pi f(\tau_P - \tau_0)} - |H(f)| \alpha^2] df$$

For the calculation of the single parameters one can analyze parts of the cross-correlation function at $\tau = 0$. With regard to the phase $\varphi$, for example, the imaginary part with even $|H(f)|$ and $|S_T(f)|$ can be analyzed:

$$\epsilon_\varphi = \text{Imag}\{l_{cv}(0)\} =$$
$$\lim_{T \to +\infty} \frac{2}{T} \int_{-\infty}^{+\infty} |S_T(f)|^2 \cdot |H(f)| \sin(\varphi_P - \varphi) \cos(2\pi f(\tau_P - \tau_0)) df$$

In case of $\varphi = \varphi_P$ the imaginary part becomes zero. In case of values other than zero the sign can be used as an indication for decreasing or increasing the phase $\varphi$ respectively. A closed-loop control can be implemented for the adaption.

The parameter $\tau_0$ can be determined when the components of the cross-correlation function are determined at positive and negative frequencies:

$$\epsilon_{\tau_0} = \text{Imag}\left\{ \lim_{T \to +\infty} \frac{1}{T} \left[ \int_{-\infty}^{0} |S_T(f)|^2 \cdot |H(f)| e^{j(\varphi_P - \varphi)} e^{j2\pi f(\tau_P - \tau_0)} df - \int_{0}^{+\infty} |S_T(f)|^2 \cdot |H(f)| e^{j(\varphi_P - \varphi)} e^{j2\pi f(\tau_P - \tau_0)} df \right] \right\}$$

Accordingly, it results:

$$\epsilon_{\tau_0} \lim_{T \to +\infty} \frac{2}{T} \int_{0}^{+\infty} |S_T(f)|^2 \cdot |H(f)| \cos(\varphi_P - \varphi) \sin(2\pi f(\tau_P - \tau_0)) df$$

In case of $\tau_0=\tau_P$ the equation becomes zero. Values other than zero indicate with its sign a decrease or an increase for $\tau_0$. Again, a closed-loop control can be implemented for the adaption.

For the adaption of the parameter a the real part of the cross-correlation function can be analyzed:

$$\epsilon_\alpha = \text{Real}\{l_{cv}(0)\}$$
$$= \lim_{T\to+\infty} \frac{2}{T} \int_0^{+\infty} |S_T(f)|^2 \cdot |H(f)|$$
$$[\alpha\beta\cos(\varphi_P - \varphi)\cos(2\pi f(\tau_P - \tau_0)) - |H(f)|\alpha^2]df$$

For an ideal rectangle highpass filter H(f) with parameters $\tau_0=\tau_P$ and $\varphi=\varphi_P$ the real part of the cross-correlation function becomes zero in case $\alpha=\beta$. Values other than zero indicate with its sign again a needed decrease or increase of the amplification factor $\alpha$.

Accordingly, it has been shown that the phase, the amplitude and the delay of the compensation signal can be adaptively controlled to become an effective compensation of undesired frequency components outside the used channel in the transmission signal. However, the use of the cross-correlation function is a possible example to do so.

In the data transmission device 1 according to FIG. 1 the adapter 12 is placed in a feedback path 11. The adapter 12 further comprises an implemented comparator 14, which compare, for example with the aid of a cross-correlation function, the compensated transmission signal v(t) with the compensation signal c(t).

Figure 2:
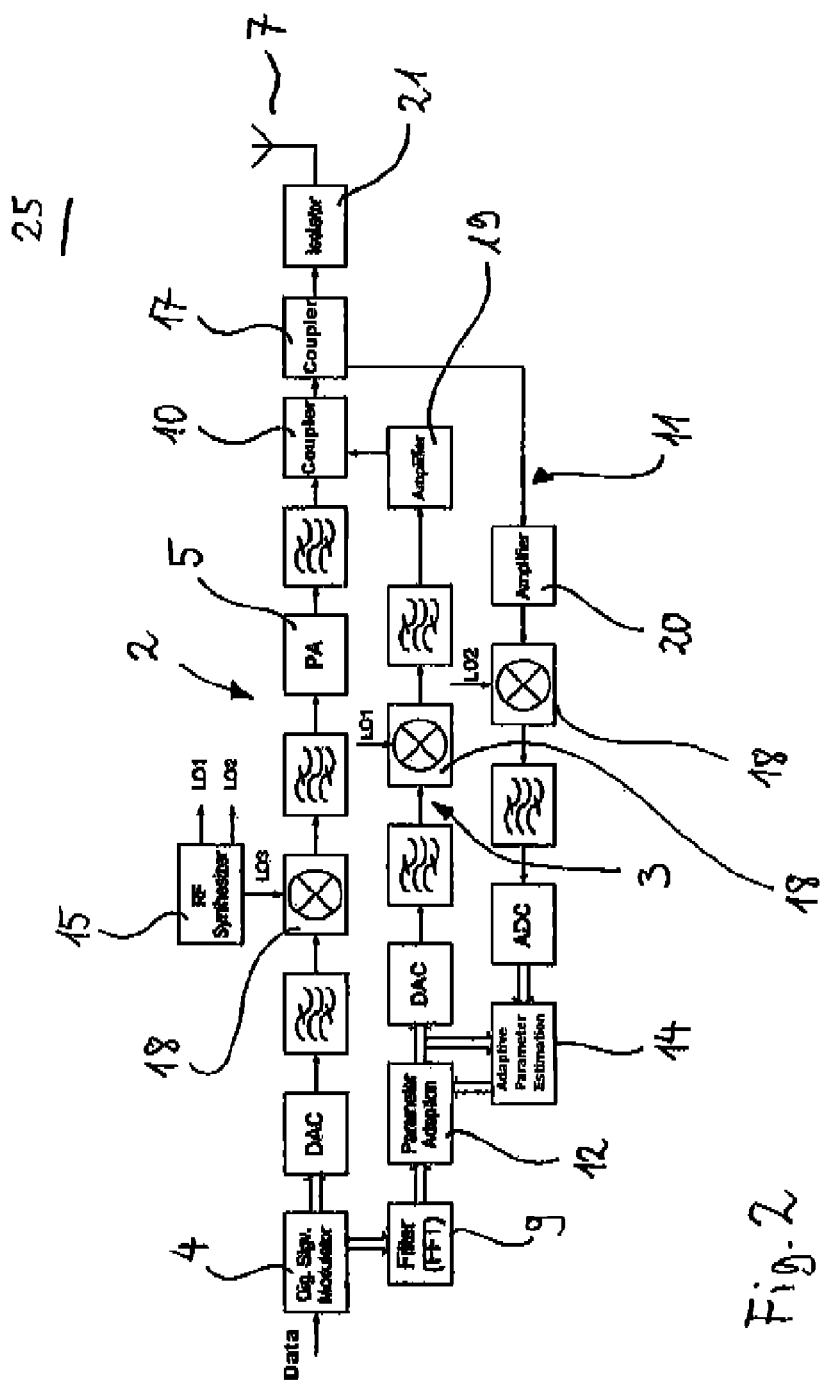
FIG. 2 shows a block diagram explaining the compensation of undesired frequency components, where the modulated carrier signal is generated in an intermediate frequency channel.

The data transmission device 25 according to FIG. 2 comprises a modulator 4, which generates a digital modulated carrier signal with a carrier frequency within an intermediate frequency band. A digital to analog converter DAC converts the digital modulated carrier signal, which is discrete in time and value, into an analog signal, which is continuous in time. Along the transmission path 2 frequency components in the continuous modulated carrier signal are removed subsequently with a respective filter, which for example is realized with a bandpass filter. Downstream of the filter the signal is frequency up-converted to a RF signal by frequency-mixing. In a radio frequency synthesizer 15 a radio frequency local oscillator signal LO3 is generated, which is mixed in the frequency-mixer 18 with the modulated carrier signal. In another subsequent bandpass filter undesired mixing products are eliminated. The radio frequency signal is then amplified in the power amplifier 5 to an intensity level needed for radio transmission. Undesired harmonics of the carrier frequency are removed in another filter. The output signal of the filter than in similar known devices will be used for radio transmission via the antenna 7.

The shown data transmission device 25 additionally comprises a compensation path 3. For a compensation signal the digital output signal of the modulator 4 is also fed into a filter 9, which removes the frequency components of the digital modulated carrier signal within the used transmission channel. In the digital adapter 12, the filtered signal is adapted with regard to its amplitude, to its phase and/or to its delay time. In a subsequent digital to analog converter DAC a continuous compensation signal is generated. Undesired frequency components are eliminated with a filter. In a frequency mixer 18 the signal is frequency-up converted to a radio frequency compensation signal. For the up-conversion another radio frequency local oscillator signal LO1 of the synthesizer 15 is used. In a downstream filter undesired mixing products are eliminated. An amplifier 19 amplifies the compensation signal to the needed power level. In the coupler 10, the amplified compensation signal is subtracted from the amplified transmission signal. The undesired frequency components outside the own transmission channel are eliminated. The compensated transmission signal then is transmitted with antenna 7.

The amplitude, the phase and/or the delay time of the compensation signal are adaptively controlled. With the coupler 17 the compensated transmission signal along a feedback path 11 is fed to an amplifier 20 and then frequency down-converted in a frequency mixer 18 to an intermediate carrier frequency. Another local oszillator signal LO2 of the synthesizer 15 is used for the down-conversion. In a subsequent filter undesired mixing components are removed. With an analog to digital converter ADC the compensated transmission signal, used as a reference signal, is converted to a digital signal discrete in time and value. In a comparator 14 the digital reference signal is compared with the already adapted digital compensation signal. Based on that comparison the phase, the amplitude and/or the delay time of the compensation signal are modified with a respective adapter 12.

Along the transmission path 5, an isolator 21 is placed upstream of the antenna 7. Reflection signals travelling back from the antenna 7 into the transmission path 2 are removed. The coupling elements 17, which allow measuring of the compensated transmission signal in the transmission path 2 are placed downstream of the coupler 0. This avoids an undesired backtravelling of the compensation signal to the power amplifier 5.

Figure 3:
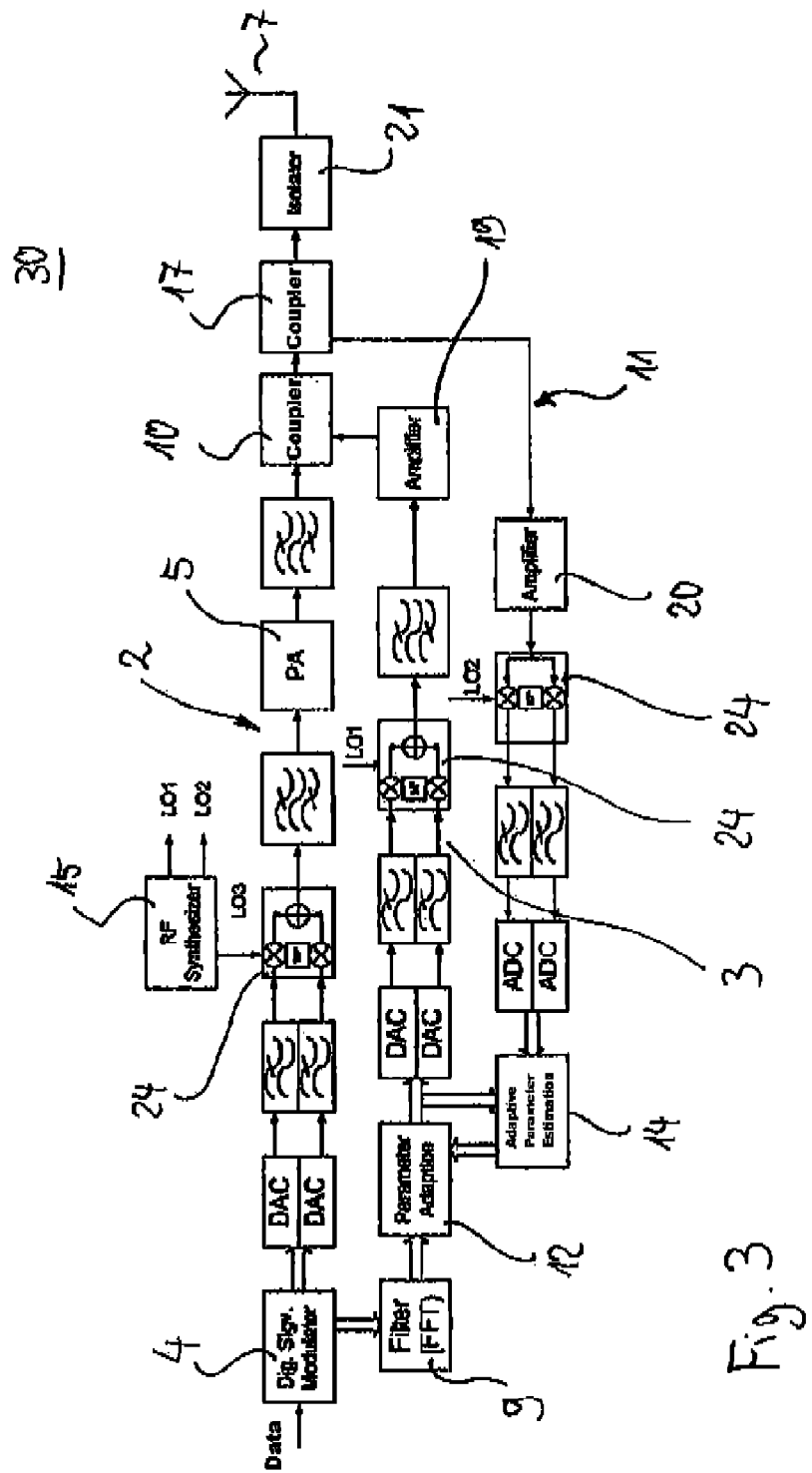
FIG. 3 shows a block diagram explaining the compensation of undesired frequency components, where the modulated carrier signal is generated as an IQ-signal.

In FIG. 3 another data transmission device 30 is shown. In contrast to the data transmission device 20 according to FIG. 2 a digital modulated carrier signal in the modulator 4 is generated as an IQ-signal, comprising an in-phase component and a quadrature-component. With separate digital-to-analog converters both components are converted to continuous signals. In quadrature-mixers 24 the in-phase component and the quadrature-component both are mixed to a radio frequency signal. Similar to the device 20 shown in FIG. 2 mixers 24 are placed in the transmission path 2, the compensation path 3 and in the feedback path 11 respectively. Local oscillator signals LO1, LO2 and LO3 of a synthesizer 15 are used for frequency up-conversion and for frequency down-conversion respectively. Preferably, they are derived from the same reference oscillator in order to maintain a fixed phase relationship. In the easiest case these signals are just buffered versions of the same source.

Figure 4:
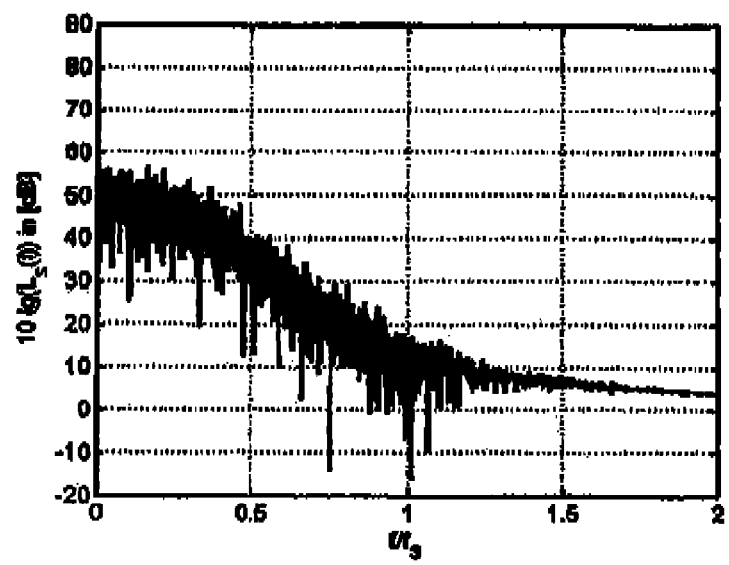
FIGS. 4-8 show power density spectra of signals to explain the concept of eliminating undesired frequency components by the use a compensation signal.
Figure 5:
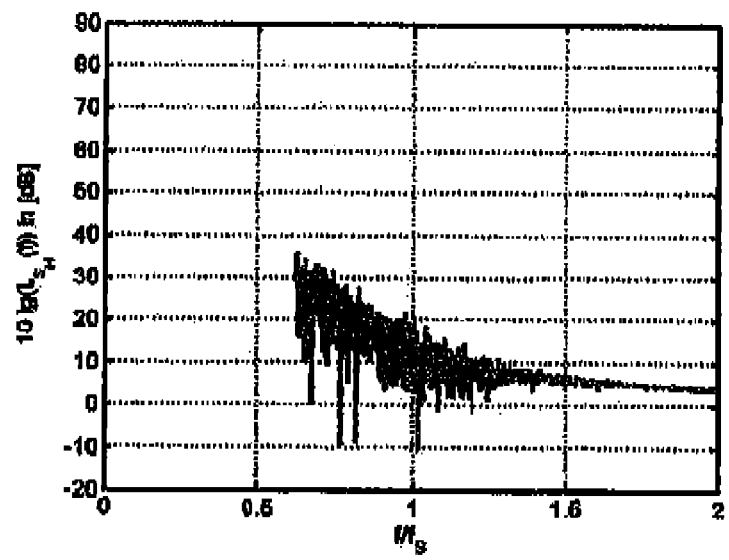

FIGS. 4 to 8 show power density spectra of CPM modulated carrier signals at different stages in a data transmission device 1 similar to FIG. 1. FIG. 4 shows the power spectral density of the modulated carrier signal s(t) generated in the modulator 4. The power density spectrum after having passed the filter 9 with a rectangle highpass characteristic is shown in FIG. 5. The cutting frequency is choosen at 0.625 $f_s$. The frequency components within the used transmission channel are removed.

Figure 6:
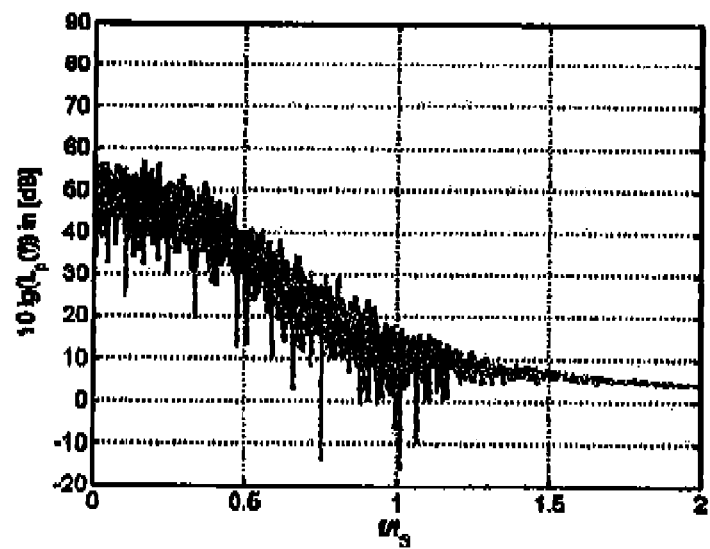

FIG. 6 shows the amplified modulated carrier signal p(t) which has passed the power amplifier 5. The power density spectrum has not been changed due to the fact that a modulated signal with a constant envelope wave form is used.

Figure 7:
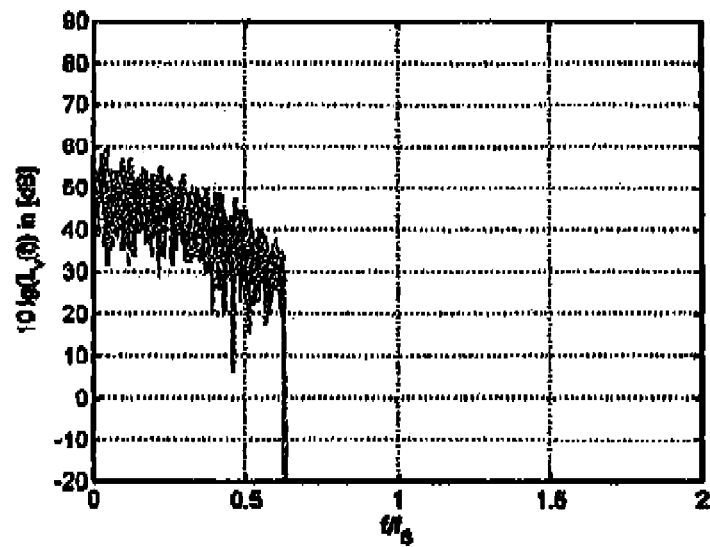

FIG. 7 displays the power density spectrum of the compensated transmission signal v(t). The undesired frequency components outside the used transmission channel are all removed.

Figure 8:
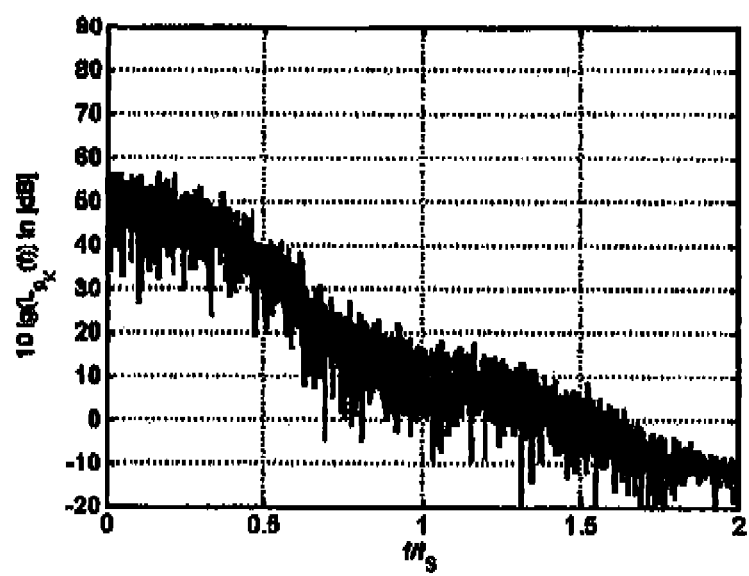

Retransmission of the compensated transmission signal v(t) to the power amplifier 5 will result in a reestablishment of the removed frequency components. This is shown in FIG. 8, which displays the power density spectrum of a re-amplified signal $s_K(t)=s(t)-s_H(t)$, which is similar to the compensated signal v(t). The power density spectrum according to FIG. 8 again shows significant spectral components outside the bandwidth of the used frequency channel.

Accordingly, as shown in FIGS. 2 and 3 isolators like circulators should be placed downstream of the power amplifier 5.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for transmitting data, comprising:
   generating, along a transmission path based on the data to be transmitted, a modulated carrier signal with a constant envelope waveform, the carrier signal having a carrier frequency within a given transmission channel, which is comprised of a number of frequencies;
   amplifying the modulated carrier signal to a transmission signal;
   filtering, along a compensation path, the modulated carrier signal, wherein frequency components within the transmission channel are removed, and at least one of a phase, an amplitude, or a delay of the filtered signal is modified thereby generating a compensation signal;
   subtracting the compensation signal from the transmission signal, thereby generating a compensated transmission signal, wherein the compensated transmission signal is transmitted; and
   comparing, along a feedback path, the compensated transmission signal with the compensation signal or with the filtered signal, and at least one of the phase, the amplitude, or the delay of the compensation signal is adapted based on the comparison result.

2. The method according to claim 1, wherein the modulated carrier signal is generated according based on frequency modulation, frequency shift keying modulation, phase modulation, phase shift keying modulation, or continuous phase modulation.

3. The method according to claim 1, wherein the modulated carrier signal is amplified in the transmission path with a non-linear power amplifier.

4. The method according to claim 1, wherein the modulated carrier signal along the transmission path and the compensation signal along the compensation path are each frequency up-converted to a RF signal.

5. The method according to claim 4, wherein the modulated carrier signal is generated with a carrier frequency within an intermediate frequency band, and wherein both the modulated carrier signal and the compensation signal are frequency up-converted to a RF signal.

6. The method according to claim 4, wherein the modulated carrier signal is generated with an in-phase component and with a quadrature component, and wherein both the modulated carrier signal and the compensation signal with a quadrature-mixer are frequency up-converted to a RF signal.

7. The method according to claim 1, wherein the modulated carrier signal is generated as a digital signal, the digital signal being discrete in time and value.

8. The method according to claim 7, wherein the digital signal of the modulated carrier signal is digitally filtered and modified in at least one of a phase, an amplitude, or a delay.

9. The method according to claim 8, wherein a cross-correlation of the compensated transmission signal and the compensation signal or a cross-correlation of the compensated transmission signal and the filtered signal is regarded for comparison.

10. The method according to claim 8, wherein the compensated transmission signal is digitized, and wherein the digitized compensated transmission signal is compared with a digital signal of the compensation signal.

11. The method according to claim 1, wherein the compensated transmission signal is transmitted with an antenna by wireless transmission.

12. The method according to claim 11, wherein reflection signals from the antenna back into the transmission path are suppressed.

13. The method according to claim 12, wherein, along the transmission path, a back travelling of the compensation signal to the non-linear amplifier is suppressed.

14. A data transmission device comprising:
    along a transmission path:
       a modulator for generating a modulated carrier signal with a constant envelope;
       an amplifier; and
       a transmitter arranged downstream of the amplifier along the transmission path, and
    along a compensation path:
       a filter; and
       an adapter for modifying at least one of a phase, an amplitude, or a delay of a signal travelling along the compensation path,
    wherein, along the compensation path and the transmission path, a coupler is coupled in and located upstream of the transmitter, the coupler being designed for subtracting an output signal of the compensation path from an output signal of the transmission path, and
    wherein, along a feedback path, a comparator is connected with the transmission path upstream of the transmitter and downstream of the amplifier, the compensation path being downstream of the adapter,
    wherein the comparator with the adapter are configured to modify at least one of a phase, an amplitude, or a delay of the signal travelling along the compensation path, and
    wherein the coupler is located downstream of the amplifier along the transmission path.

* * * * *